US006833328B1

(12) United States Patent
Kool et al.

(10) Patent No.: US 6,833,328 B1
(45) Date of Patent: Dec. 21, 2004

(54) METHOD FOR REMOVING A COATING FROM A SUBSTRATE, AND RELATED COMPOSITIONS

(75) Inventors: Lawrence Bernard Kool, Clifton Park, NY (US); John Robert LaGraff, Niskayuna, NY (US); James Anthony Ruud, Delmar, NY (US)

(73) Assignee: General Electric Company, Niskayuna, NY (US)

( * ) Notice: Subject to any disclaimer, the term of this patent is extended or adjusted under 35 U.S.C. 154(b) by 202 days.

(21) Appl. No.: 09/591,531

(22) Filed: Jun. 9, 2000

(51) Int. Cl.[7] .......................... H01L 21/461; C23G 1/02

(52) U.S. Cl. ....................... 438/745; 438/767; 438/439; 438/158; 438/653; 438/669; 438/221; 438/218; 134/3; 134/13; 134/28; 134/41

(58) Field of Search ................................ 438/745, 767, 438/787, 439, 158, 653, 669, 753, 221, 218, 672, 584; 134/3, 13, 28, 41

(56) References Cited

U.S. PATENT DOCUMENTS

| | | | | | |
|---|---|---|---|---|---|
| 3,373,114 | A | | 3/1968 | Grunwald | |
| 3,458,353 | A | | 7/1969 | Baldi | |
| 3,514,407 | A | | 5/1970 | Missel | |
| 3,607,398 | A | | 9/1971 | Lucas | |
| 3,622,391 | A | | 11/1971 | Baldi | |
| 3,779,879 | A | | 12/1973 | Scott | |
| 3,833,414 | A | | 9/1974 | Grisik et al. | |
| 3,922,390 | A | | 11/1975 | Otrhalck et al. | |
| 4,004,956 | A | | 1/1977 | Brindisi, Jr. | |
| 4,339,282 | A | | 7/1982 | Lada et al. | |
| 4,425,185 | A | | 1/1984 | Fishter et al. | |
| 5,817,182 | A | * | 10/1998 | O'Brien | 134/1.3 |
| 5,916,656 | A | * | 6/1999 | Kitayama et al. | 428/64.1 |
| 5,962,145 | A | * | 10/1999 | Matsukawa | 428/461 |
| 6,274,027 | B1 | * | 8/2001 | Kiya et al. | 205/705 |

FOREIGN PATENT DOCUMENTS

| | | | | | |
|---|---|---|---|---|---|
| DE | 2421313 | A | | 11/1974 | |
| EP | 1050604 | A | | 11/1971 | |
| EP | 106459 | A | | 4/1984 | |
| FR | 950328 | A | | 9/1949 | |
| GB | 2115013 | A | | 9/1983 | |
| JP | 56096083 | A | * | 8/1981 | 134/40 |
| JP | 56166386 | A | * | 12/1981 | C25B/11/16 |
| JP | 356166386 | A | * | 12/1981 | C25B/11/16 |
| WO | 9113186 | | | 9/1991 | |
| WO | 9303198 | | | 2/1993 | |

OTHER PUBLICATIONS

"Loesung Zum Abloesen Einer Sn/Pb–Legierungsschicht", Galvanotechnik, Eugen G. Leuze Verlag. Saulgau/Wurtt, DE, vol. 79, No. 9, Sep. 1988, p. 2987 XP000082966, ISSN: 0016–4232 Abstract.

European SEarch Report.

* cited by examiner

*Primary Examiner*—Matthew Smith
*Assistant Examiner*—Igwe U. Anya
(74) *Attorney, Agent, or Firm*—Paul J. DiConza; Patrick K. Patnode

(57) ABSTRACT

A method for selectively removing one or more coatings from the surface of a substrate is described. The coating is treated with an aqueous composition which includes an acid of the formula $H_xAF_6$, or precursors to such an acid. In that formula, A is Si, Ge, Ti, Zr, Al, and Ga; and x is 1–6. The acid is often $H_2SiF_6$. The composition may sometimes include at least one additional acid, such as phosphoric acid. The coating being removed is often an aluminide coating or an MCrAl(X)-type material. The substrate is usually a polymer or a metal, such as a superalloy.

37 Claims, No Drawings

METHOD FOR REMOVING A COATING FROM A SUBSTRATE, AND RELATED COMPOSITIONS

BACKGROUND OF THE INVENTION

The present invention is generally directed to methods for removing a coating on a substrate. More particularly, the invention relates to the removal of overlay or diffusion coatings on a metal substrate, e.g., a superalloy component.

As operating temperatures of gas turbine engines increase to achieve improved fuel efficiency, advanced oxidation-resistant coatings are required for better environmental protection, as well as improved thermal barrier coating life. Current coatings used on components in gas turbine hot sections, such as blades, nozzles, combustors, and transition pieces, generally belong to one of two classes: diffusion coatings or overlay coatings.

State-of-the-art diffusion coatings are generally formed of aluminide-type alloys, such as nickel-aluminide, platinum-aluminide, or nickel-platinum-aluminide. Overlay coatings typically have the composition MCrAl(X), where M is an element from the group consisting of Ni, Co, Fe, and combinations thereof, and X is an element from the group consisting of Y, Ta, Si, Hf, Ti, Zr, B, C, and combinations thereof. Diffusion coatings are formed by depositing constituent components of the coating, and reacting those components with elements from the underlying substrate, to form the coating by high temperature diffusion. In contrast, overlay coatings are generally deposited intact, without reaction with the underlying substrate.

It has become commonplace to repair turbine engine components, particularly airfoils, and return those components to service. During repair, any coatings are removed to allow inspection and repair of the underlying substrate. Removal is typically carried out by immersing the component in a stripping solution containing an acid, such as a mixture of strong mineral acids (e.g., hydrochloric acid, sulfuric acid, nitric acid, hydrofluoric acid), as well as other additives.

However, some of the stripping compositions of the prior art do not remove sufficient amounts of the coatings. Further time and effort is thus required to complete the removal (e.g., by grit blasting), and this can in turn lead to a decrease in the efficiency of the repair process. Furthermore, some of the compositions that do sufficiently remove the coatings also attack the base metal of the substrate, pitting the base metal, or damaging the metal via intergranular boundary attack. Moreover, conventional stripping solutions often emit an excessive amount of hazardous, acidic fumes. Due to environmental, health and safety concerns, such fumes must be scrubbed from ventilation exhaust systems.

It is thus apparent that new processes for removing coatings from substrates (e.g., metal substrates) would be welcome in the art. The processes should be capable of removing substantially all of the coating material, while not attacking the substrate itself. It would also be desirable if the processes did not result in the formation of an unacceptable amount of hazardous fumes. Moreover, the processes should be capable of removing a substantial amount of coating material that might be located in indentations, hollow regions, or holes in the substrate, e.g., passage holes in a superalloy substrate.

SUMMARY OF THE INVENTION

One embodiment of the invention is directed to a method for selectively removing at least one coating from the surface of a substrate, comprising the step of contacting the coating with an aqueous composition which comprises an acid having the formula $H_xAF_6$, or precursors to said acid. Usually, A is selected from the group consisting of Si, Ge, Ti, Zr, Al, and Ga; and x is 1–6. The acid is typically present at a level in the range of about 0.05 M to about 5 M. In some preferred embodiments, the aqueous composition comprises the compound $H_2SiF_6$ or $H_2ZrF_6$. As described below, these compounds may sometimes be formed in situ.

In some embodiments, the aqueous composition further comprises at least one additional acid or precursor thereof. The additional acid usually has a pH of less than about 7 in pure water, and preferably, less than about 3.5. A variety of these secondary acids can be used, and phosphoric acid is often preferred.

In preferred embodiments, the substrate is immersed in a bath of the aqueous composition, under temperature and time conditions sufficient to selectively remove the coating. As used herein, "selective removal" of the coating (or coatings) refers to the removal of a relatively large percentage of the coating, while removing only a very small portion (or none) of the substrate material, and while not adversely affecting the substrate in any substantial manner.

The coating being removed from the substrate usually comprises at least one diffusion coating or overlay coating, e.g., an aluminide-type coating or an MCrAl(X) material, respectively. Moreover, the substrate is usually a metallic material or a polymeric material, and is often in the form of a superalloy component.

Another embodiment of the invention is directed to an aqueous composition for selectively removing a coating from the surface of a substrate, comprising an acid having the formula $H_xAF_6$, or precursors for said acid, wherein A is selected from the group consisting of Si, Ge, Ti, Zr, Al, and Ga; and x is 1–6. The acid is usually present in the composition at levels described hereinafter. As mentioned above and further described below, at least one additional acid may be used in conjunction with the primary acid.

Further details regarding the various features of this invention are found in the remainder of the specification.

DETAILED DESCRIPTION OF THE INVENTION

The coating that is removed from the substrate by this invention is generally in the form of a diffusion coating or an overlay coating, as mentioned above. Diffusion coatings are typically formed of aluminide-type materials, which are well-known in the art. Such materials are sometimes modified with a noble metal, such as platinum or palladium. Non-limiting examples include aluminide, platinum-aluminide, nickel-aluminide, platinum-nickel-aluminide, and mixtures thereof.

Overlay coatings were also described above. They usually have the composition MCrAl(X), where M is an element selected from the group consisting of Ni, Co, Fe, and combinations thereof; and X is an element selected from the group consisting of Y, Ta, Si, Hf, Ti, Zr, B, C, and combinations thereof. Methods for forming and applying both types of coatings are known in the art.

The thickness of a diffusion coating or an overlay coating will depend on various factors, such as the type of article being coated, the composition of the substrate, and the environmental conditions to which the article will be subjected. In the case of metal-based substrates such as superalloys, an aluminide-based coating will usually have an average thickness of about 5 microns to about 125 microns.

An MCrAl(X)-type coating for such a substrate will often have an average thickness of about 50 microns to about 500 microns.

As mentioned above, the aqueous composition for some embodiments of this invention includes an acid having the formula $H_xAF_6$ In this formula, A is selected from the group consisting of Si, Ge, Ti, Zr, Al, and Ga. The subscript x is a quantity from 1 to 6, and more typically, from 1 to 3. Materials of this type are available commercially, or can be prepared without undue effort. The preferred acids are $H_2SiF_6$ or $H_2ZrF_6$. In some embodiments, $H_2SiF_6$ is especially preferred. The last-mentioned material is referred to by several names, such as "hydrofluosilicic acid", "fluorosilicic acid", and "hexafluorosilicic acid".

Precursors to the $H_xAF_6$ acid may also be used. As used herein, a "precursor" refers to any compound or group of compounds which can be combined to form the acid or its dianion $AF_6^{-2}$, or which can be transformed into the acid or its dianion under reactive conditions, e.g. the action of heat, agitation, catalysts, and the like. Thus, the acid can be formed in situ in a reaction vessel, for example.

As one illustration, the precursor may be a metal salt, inorganic salt, or an organic salt in which the dianion is ionically bound. Non-limiting examples include salts of Ag, Na, Ni, K, and $NH_4^+$, as well as organic salts, such as a quaternary ammonium salt. Dissociation of the salts in an aqueous solution yields the acid. In the case of $H_2SiF_6$, a convenient salt which can be employed is $Na_2SiF_6$.

Those skilled in the art are familiar with the use of compounds which cause the formation of $H_xAF_6$ within an aqueous composition. For example, $H_2SiF_6$ can be formed in situ by the reaction of a silicon-containing compound with a fluorine-containing compound. An exemplary silicon-containing compound is $SiO_2$, while an exemplary fluorine-containing compound is hydrofluoric acid (i.e., aqueous hydrogen fluoride).

When used as a single acid, the $H_xAF_6$ acid appears to be quite effective for removing the coatings described above, without adversely affecting the substrate. Moreover, the $H_xAF_6$ acid appears to be especially useful in removing aluminide-type coatings, such as platinum aluminide. The preferred level of acid employed will depend on various factors, such as the type and amount of coating being removed; the location of the coating material on a substrate; the type of substrate; the thermal history of the substrate and coating (e.g., the level of interdiffusion); the technique by which the substrate is being exposed to the treatment composition (as described below); the time and temperature used for treatment; and the stability of the acid in solution.

In general, the $H_xAF_6$ acid is present in a treatment composition at a level in the range of about 0.05 M to about 5 M, where M represents molarity. (Molarity can be readily translated into weight or volume percentages, for ease in preparing the solutions). Usually, the level is in the range of about 0.2 M to about 3.5 M. In the case of $H_2SiF_6$, a preferred concentration range is often in the range of about 0.2 M to about 2.2 M. Adjustment of the amount of $H_xAF_6$ acid, and of other components described below, can readily be made by observing the effect of particular compositions on coating removal from the substrate.

As mentioned above, the aqueous composition may contain at least one additional acid, i.e., in addition to the "primary" acid, $H_xAF_6$. It appears that the use of the additional acid (the "secondary" acid or acids) sometimes enhances the removal of coating material from less accessible areas of the substrate that are prone to depletion of the acidic solution. A variety of different acids can be used, and they are usually characterized by a pH of less than about 7 in pure water. In preferred embodiments, the additional acid has a pH of less than about 3.5 in pure water. In some especially preferred embodiments, the additional acid has a pH which is less than the pH (in pure water) of the primary acid, i.e., the $H_xAF_6$ material. Thus, in the case of $H_2SiF_6$, the additional acid is preferably one having a pH of less than about 1.3.

Various types of acids may be used, e.g., a mineral acid or an organic acid. Non-limiting examples include phosphoric acid, nitric acid, sulfuric acid, hydrochloric acid, hydrofluoric acid, hydrobromic acid, hydriodic acid, acetic acid, perchloric acid, phosphorous acid, phosphinic acid, alkyl sulfonic acids (e.g., methanesulfonic acid), and mixtures of any of the foregoing. Those skilled in the art can select the most appropriate additional acid, based on observed effectiveness and other factors, such as availability, compatibility with the primary acid, cost, and environmental considerations. Moreover, a precursor of the acid may be used (e.g., a salt), as described above in reference to the primary acid. In some preferred embodiments of this invention, the additional acid is selected from the group consisting of phosphoric acid, nitric acid, sulfuric acid, hydrochloric acid, hydrofluoric acid, and mixtures thereof. In some especially preferred embodiments (e.g., when the primary acid is $H_2SiF_6$), the additional acid is phosphoric acid.

The amount of additional acid employed will depend on the identity of the primary acid, and on many of the factors set forth above. Usually, the additional acid is present in the composition at a level in the range of about 0.1 M to about 20 M. In some preferred embodiments (e.g., in the case of phosphoric acid), the preferred range is from about 0.5 M to about 5 M. Furthermore, some especially preferred embodiments contemplate a range of about 2 M to about 4 M. As alluded to earlier, longer treatment times and/or higher treatment temperatures may compensate for lower levels of the acid, and vice versa. Experiments can be readily carried out to determine the most appropriate level for the additional acid.

The aqueous composition of the present invention may include various other additives which serve a variety of functions. Non-limiting examples of these additives are inhibitors, dispersants, surfactants, chelating agents, wetting agents, deflocculants, stabilizers, anti-settling agents, and anti-foam agents. Those of ordinary skill in the art are familiar with specific types of such additives, and with effective levels for their use. An example of an inhibitor for the composition is a relatively weak acid like acetic acid, mentioned above. Such a material tends to lower the activity of the primary acid in the composition. This is desirable in some instances, e.g., to decrease the potential for pitting of the substrate surface.

Various techniques can be used to treat the substrate with the aqueous composition. For example, the substrate can be continuously sprayed with the composition, using various types of spray guns. A single spray gun could be employed. Alternatively, a line of guns could be used, and the substrate could pass alongside or through the line of guns (or multiple lines of guns). In another alternative embodiment, the coating removal composition could be poured over the substrate (and continuously recirculated).

In preferred embodiments, the substrate is immersed in a bath of the aqueous composition. Immersion in this manner (in any type of vessel) often permits the greatest degree of contact between the aqueous composition and the coating which is being removed. Immersion time and bath temperature will depend on many of the factors described above, such as the type of coating being removed, and the acid (or acids) being used in the bath. Usually, the bath is maintained at a temperature in the range of about room temperature to about 100° C., while the substrate is immersed therein. In preferred embodiments, the temperature is maintained in the range of about 45° C. to about 90° C. The immersion time may vary considerably, but is usually in the range of about 10 minutes to about 72 hours, and preferably, from about 1 hour to about 20 hours. Longer immersion times may compensate for lower bath temperatures. After removal from the bath (or after contact of the coating by any technique mentioned above), the substrate is typically rinsed in water, which also may contain other conventional additives, such as a wetting agent.

A variety of substrates may include the coating(s) being removed according to this invention. Usually, the substrate is a metallic material or a polymeric (e.g., plastic) material. As used herein, "metallic" refers to substrates which are primarily formed of metal or metal alloys, but which may also include some non-metallic components. Non-limiting examples of metallic materials are those which comprise at least one element selected from the group consisting of iron, cobalt, nickel, aluminum, chromium, titanium, and mixtures which include any of the foregoing (e.g., stainless steel).

Very often, the metallic material is a superalloy. Such materials are known for high-temperature performance, in terms of tensile strength, creep resistance, oxidation resistance, and corrosion resistance, for example. The superalloy is typically nickel-, cobalt-, or iron-based, although nickel- and cobalt-based alloys are favored for high-performance applications. The base element, typically nickel or cobalt, is the single greatest element in the superalloy by weight. Illustrative nickel-base superalloys include at least about 40 wt % Ni, and at least one component from the group consisting of cobalt, chromium, aluminum, tungsten, molybdenum, titanium, and iron. Examples of nickel-base superalloys are designated by the trade names Inconel®D, Nimonic®, Rene® (e.g., Rene®80-, Rene®95, Rene®142, and Rene®N5 alloys), and Udimet®, and include directionally solidified and single crystal superalloys. Illustrative cobalt-base superalloys include at least about 30 wt % Co, and at least one component from the group consisting of nickel, chromium, aluminum, tungsten, molybdenum, titanium, and iron. Examples of cobalt-base superalloys are designated by the trade names Haynes®, Nozzaloy®, Stellite® and Ultimet®.

Polymeric substrates which can be treated by this invention are formed from materials which are substantially acid-resistant. In other words, such materials are not adversely affected by the action of the acid (or acids), to the degree which would make the substrate unsuitable for its intended end use. (Usually, such materials are highly resistant to hydrolysis). Non-limiting examples of such materials are polyolefins (e.g., polyethylene or polypropylene), polytetrafluroethylenes, epoxy resins, polystyrenes, polyphenylene ethers; mixtures comprising one of the foregoing; and copolymers comprising one of the foregoing. (Those skilled in the polymer arts understand that the properties of an individual polymer may be modified by various methods, e.g., blending or the addition of additives.)

The actual configuration of a substrate may vary widely. As a general illustration, the substrate may be in the form of a houseware item (e.g., cookware), or a printed circuit board substrate. In many embodiments, superalloy substrates are in the form of a combustor liners, combustor domes, shrouds, or airfoils. Airfoils, including buckets or blades, and nozzles or vanes, are typical substrates that are stripped according to embodiments of the present invention. The present invention is useful for removing coatings from the flat areas of substrates, as well as from curved or irregular surfaces which may include indentations, hollow regions, or holes (e.g., film cooling holes).

The method of the present invention may be used in conjunction with a process for repairing protective coatings which are sometimes applied over the coatings described above. As an example, thermal barrier coatings (TBC's)—often based on zirconia—are frequently applied over aluminide coatings or MCrAl(X)-coatings, to protect turbine engine components from excessive thermal exposure. The periodic overhaul of the TBC sometimes requires that any underlying layers also be removed. The TBC can be removed by various methods, such as grit blasting or chemical techniques. The underlying coating or multiple coatings can then be removed by the process described above. The component can subsequently be conventionally re-coated with the aluminide and or MCrAl(X) coating, followed by standard re-coating with fresh TBC.

Another embodiment of this invention is directed to an aqueous composition for selectively removing a coating from the surface of a substrate. As described previously, the composition includes an acid having the formula $H_xAF_6$, or precursors for said acid, wherein A is selected from the group consisting of Si, Ge, Ti, Zr, Al, and Ga; and x is 1–6. The acid is usually present in the composition at a level in the range of about 0.05 M to about 5 M.

Moreover, the composition sometimes includes at least one additional acid or precursor thereof. A variety of additional acids can be used. A preferred group includes phosphoric acid, nitric acid, sulfuric acid, hydrochloric acid, hydrofluoric acid, or mixtures thereof. The additional acid is present in the composition at a level in the range of about 0.1 M to about 20 M, and preferably, in the range of about 0.5 M to about 5 M.

The following examples are merely illustrative, and should not be construed to be any sort of limitation on the scope of the claimed invention.

EXAMPLE 1

A coupon formed of a directionally-solidified nickel-base superalloy was coated with an MCrAlY-type material, having an approximate, nominal composition as follows: 32 wt % Ni, 36 wt % Co, 22 wt % Cr, 10 wt % Al, and 0.3 wt % Y. The coating was applied by a thermal spray technique, to a thickness of about 250 microns. The coated surface was then diffusion-aluminided to a depth of about 50 microns.

The coupon was then immersed in a solution of 75 volume % fluorosilicic acid ($H_2SiF_6$, at 23 wt % concentration) and 25 volume % phosphoric acid (86 wt % concentration), and stirred at 80° C. for 3 hours. The entire coating was removed, without any visible damage to the underlying substrate.

EXAMPLE 2

Another coupon formed of a nickel-base superalloy was used in this experiment. The coupon was taken from a gas turbine bucket. External regions of the bucket had been coated with an MCrAlY-type coating, having the following, nominal composition: 29 wt % Cr, 6 wt % Al, 1 wt % Y, balance Co. Both the external regions and internal regions (e.g., passage holes) were then diffusion-aluminided. (The bucket had previously been used in heavy service, i.e., it had been subjected to thermal exposure and thermal cycles for a considerable period of time. It is often very difficult to remove diffusion coatings and overlay coatings from such articles).

The coated coupon was immersed in a solution of 75 volume % fluorosilicic acid (23 wt % concentration) and 25 volume % phosphoric acid (86 wt % concentration), and stirred at 80° C. for 6 hours. The entire coating system (MCrAlY/aluminide) was removed, without any visible damage to the underlying substrate.

EXAMPLE 3

Another turbine engine bucket (also formed of a directionally-solidified nickel-base superalloy) was used in this experiment. This bucket included internal and external regions, as in Example 2. The same type of coating system had previously been deposited in those regions. This bucket had been subjected to extreme service conditions, in terms of thermal exposure and thermal cycling.

The entire bucket was immersed in five gallons (18.925 liters) of the fluorosilicic/phosphoric acid solution used above in Example 2. The bucket was immersed for 15 hours at 72° C., while stirring. The MCrAlY/aluminide coating was nearly completely stripped in 8 hours. Remaining portions of the coating were easily removed by gentle grit blasting.

EXAMPLE 4

Another coupon formed of a nickel-base superalloy was taken from a bucket of a gas turbine. The same type of coating system (i.e., MCrAlY-type with diffusion aluminide) had previously been deposited on internal and external regions, as described in Example 2.

The coupon was immersed in a solution of 75 volume % fluorosilicic acid (23 wt % concentration), 12.5 volume % phosphoric acid (86 wt % concentration), and 12.5 volume % hydrochloric acid, and stirred at 80° C. for 4 hours. The entire coating was removed without any visible base metal attack. The addition of hydrochloric acid accelerated the stripping process.

EXAMPLE 5

An entire turbine bucket was used in this experiment. The bucket was formed of a nickel-base superalloy, and coated in the manner described in Example 2. The average, total coating thickness was in the range of about 75 microns to about 375 microns.

The entire bucket was immersed in a bath of 23 wt % fluorosilicic acid at 80° C., with stirring via an impeller. The coating gradually dissolved, and small hydrogen gas bubbles evolved. A small amount of black smut continued to adhere to the part. After 12 hours, the part was rinsed, and the smut was removed by means of gentle grit blasting. Metallographic examination of the part indicated that all of the external coating had been substantially removed from this substrate. Moreover, the base alloy did not appear to be attacked or adversely affected.

EXAMPLE 6

A sample of a nickel-base superalloy coated with platinum aluminide was immersed in 23 wt % fluorosilicic acid at 80° C. for 4 hours, with gentle stirring. The sample was then rinsed and examined metallographically. This treatment completely stripped the platinum aluminide, without damaging the underlying base alloy.

It should also be noted that the compositions which utilized $H_2SiF_6$, or a combination of $H_2SiF_6$ and phosphoric acid, produced very little acidic fuming. (The Example 4 composition, which included hydrochloric acid, did fume to some extent.) The lack of excessive fuming for most of these compositions is an additional attribute which is sometimes important in a larger-scale, industrial setting.

Having described preferred embodiments of the present invention, alternative embodiments may become apparent to those skilled in the art, without departing from the spirit of this invention. Accordingly, it is understood that the scope of this invention is to be limited only by the appended claims.

What is claimed is:

1. A method for selectively removing at lease one coating from the surface of a substrate, comprising the step of contacting the coating with an aqueous composition which comprises at least one of an acid having the formula $H_xAF_6$, and precursors to said acid, wherein A is selected from the group consisting of Si, Ge, Ti, Zr, Al, and Ga; wherein x is 1–6; and wherein contacting said coating further comprises contacting a coating comprising at least one of a. an aluminide material, and b. MCrAl(X), where M is an element selected from the group consisting of Ni, Co, Fe, and combinations thereof; and X is an element selected from the group consisting of Y, Ta, Si, Hf, Ti, Zr, B, C, and combinations thereof;

said coating comprising at least one of a diffusion coating and an overlay coating.

2. The method of claim 1, wherein x is 1–3.

3. The method of claim 1, wherein the acid is present at a level in the range of about 0.05 M to about 5 M.

4. The method of claim 3, wherein the acid is present at a level in the range of about 0.2 M to about 3.5 M.

5. The method of claim 1, wherein the precursor is a salt of the acid.

6. The method of claim 1, wherein the aqueous composition comprises the compound H2SiF6 or H2ZrF6.

7. The method of claim 6, wherein the H2SiF6 compound is formed in situ within the aqueous composition, by the dissociation of a corresponding salt of the compound; or by the reaction of a silicon-containing compound with a fluorine-containing compound.

8. The method of claim 7, wherein the silicon-containing compound is SiO2, and the fluorine-containing compound is HF.

9. The method of claim 1, wherein the aqueous composition further comprises at least one additional acid or precursor thereof.

10. The method of claim 9, wherein the additional acid has pH of less than about 7 in pure water.

11. The method of claim 10, wherein the additional acid has a pH of less than about 3.5 in pure water.

12. The method of claim 9, wherein the additional acid is a mineral acid.

13. The method of claim 9, wherein the additional acid is selected from the group consisting of phosphoric acid, nitric acid, sulfuric acid, hydrochloric acid, hydrofluoric acid, hydrobromic acid, hyrdriodic acid, acetic acid, perchloric acid, phosphorous acid, phosphinic acid, alkyl sulfonic acids, and mixtures of any of the foregoing.

14. The method of claim 9, wherein the additional acid is present in the composition at a level in the range of about 0.1 M to about 20 M.

15. The method of claim 14, wherein the additional acid is phosphoric acid.

16. The method of claim 15, wherein the phosphoric acid is present at a level in the range of about 0.5 M to about 5 M.

17. The method of claim 1, wherein the substrate is immersed in a bath of the aqueous composition.

18. The method of claim 17, wherein the bath is maintained at a temperature in the range of about room temperature to about 100° C., while the substrate is immersed therein.

19. The method of claim 18, wherein the temperature is the range of about 45° C. to about 90° C.

20. The method of claim 18, wherein the immersion time is in the range of about 10 minutes to about 72 hours.

21. The method of claim 20, wherein the immersion time is in the range of about 60 minutes to about 20 hours.

22. The method of claim 17, wherein the bath further comprises at least one additive selected from the group consisting of inhibitors, dispersants, surfacants, chelating agents, wetting agents, deflocculants, stabilizers, anti-settling agents, and anti-foam agents.

23. The method of claim 1, wherein the aluminide material is selected from the group consisting of aluminide, noble metal-aluminide, nickel-aluminide, noble metal-nickel-aluminide, and mixtures thereof.

24. The method of claim 1, wherein the substrate is selected from the group consisting of a metallic material and a polymeric material.

25. The method of claim 24, wherein the polymeric material is selected from the group consisting of polyolefins, polytetrafluroethylenes, epoxy resins, polystyrenes, polyphenylene ethers; mixtures comprising one of the foregoing; and copolymers comprising one of the foregoing.

26. The method of claim 24, wherein the metallic material comprises at least one element selected from the group consisting of iron, cobalt, nickel, aluminum, chromium, titanium, and mixture which include any of the foregoing.

27. The method of claim 26, wherein the metallic material comprises a superalloy.

28. The method of claim 27, wherein the superalloy is nickel-based or cobalt-based.

29. The method of claim 27, wherein the superalloy is a component of a turbine engine.

30. The method of claim 29, wherein the component comprises an airfoil.

31. A method for selectively removing at least one coating material from the surface of a metallic substrate, comprising the step of contacting the coating with an aqueous composition which comprises at least one of an acid having the formula $H_xAF_6$, and precursors to said acid, wherein A is selected from the group consisting of Si, Ti, and Zr; wherein x is 1–3; and wherein contacting said coating further comprises contacting a coating comprising materials selected from the group consisting of aluminides and MCrAlY materials, wherein M is an element selected from the group consisting of Ni, Co, Fe, and combinations thereof.

32. The method of claim 31, wherein the acid is present at a level in the range of about 0.05 M to about 5 M.

33. The method of claim 31, wherein the aqueous composition further comprises at least one additional acid or precursor thereof, selected from the group consisting of phosphoric acid, nitric acid, sulfuric acid, hydrochloric acid, hydrofluoric acid, and mixtures thereof.

34. The method of claim 33, wherein the additional acid is present in the composition at a level in the range of about 0.1 M to about 20 M.

35. The method of claim 31, wherein the coating material comprises an MCrAlY layer which is diffusion-aluminided.

36. The method of claim 31, wherein the metallic substrate comprises a nickel-base or cobalt-base superalloy.

37. The method of claim 36, wherein the metallic substrate is a turbine engine airfoil.

* * * * *